United States Patent [19]
Sandell et al.

[11] Patent Number: 5,476,719
[45] Date of Patent: Dec. 19, 1995

[54] SUPERCONDUCTING MULTI-LAYER MICROSTRIP STRUCTURE FOR MULTI-CHIP MODULES AND MICROWAVE CIRCUITS

[75] Inventors: Robert D. Sandell, Manhattan Beach; Andrew D. Smith, Redondo Beach, both of Calif.

[73] Assignee: TRW Inc., Redondo Beach, Calif.

[21] Appl. No.: 293,265

[22] Filed: Aug. 17, 1994

[51] Int. Cl.$^6$ ........................................ B32B 9/00
[52] U.S. Cl. .................. 428/457; 428/930; 428/209; 428/901; 505/812; 505/850; 505/813; 505/239
[58] Field of Search ........................ 428/209, 195, 428/688, 210, 901, 930, 457; 505/230, 231, 232, 233, 234, 235, 236, 237, 238, 239, 701, 702, 703, 704, 812, 850, 813

[56] References Cited

U.S. PATENT DOCUMENTS

| | | | |
|---|---|---|---|
| 4,997,719 | 3/1991 | Ohsima | 428/901 |
| 5,070,241 | 12/1991 | Jack. | |
| 5,075,655 | 12/1991 | Pond et al.. | |
| 5,097,128 | 3/1992 | Jack. | |
| 5,105,200 | 4/1992 | Koepf. | |
| 5,116,807 | 5/1992 | Romanofsky et al.. | |
| 5,137,618 | 8/1992 | Burnett | 430/312 |
| 5,164,358 | 11/1992 | Buck et al.. | |
| 5,246,782 | 9/1993 | Kennedy et al.. | |
| 5,255,158 | 10/1993 | Kosugi. | |
| 5,258,626 | 11/1993 | Suzuki et al.. | |
| 5,266,446 | 11/1993 | Chang et al.. | |
| 5,274,249 | 12/1993 | Xi et al.. | |
| 5,274,268 | 12/1993 | Yamazaki. | |
| 5,276,398 | 1/1994 | Withers et al.. | |
| 5,283,107 | 2/1994 | Bayer et al.. | |
| 5,286,713 | 2/1994 | Yokoyama et al.. | |
| 5,287,208 | 2/1994 | Shimoto et al.. | |
| 5,287,302 | 2/1994 | Brandelik et al.. | |
| 5,288,989 | 2/1994 | Ishaque et al.. | |
| 5,296,749 | 3/1994 | Berlincourt. | |
| 5,306,521 | 4/1994 | Shimizu et al.. | |
| 5,306,927 | 4/1994 | Dalrymple et al.. | |
| 5,313,074 | 5/1994 | Tamura et al.. | |

OTHER PUBLICATIONS

Nakajima, Appl. Phys. Lett, 53(15), Oct. 10, 1988 pp. 1437–1439.
Geballe, Science vol. 259, Mar. 12, 1993 pp. 1550–1551.
Koinuma, Japanese Jour. of App. Phys. vol. 26, No. 5, May 1987 pp. L763–L765.

Primary Examiner—Patrick J. Ryan
Assistant Examiner—Patrick R. Jewik

[57] ABSTRACT

A multi-layer microstrip structure includes a substrate and a first superconducting layer deposited on the substrate. A first dielectric layer, made at least partially of benzocyclobutene (BCB), is deposited on the first superconducting layer. Additional superconducting dielectric and superconducting layers can be employed. Preferably the superconducting layers are made from niobium. The multilayer microstrip structure is ideally suited for use in passive circuit components of microwave circuits and in multi-chip modules.

10 Claims, 2 Drawing Sheets

SUPERCONDUCTING MULTI-LAYER MICROSTRIP STRUCTURE FOR MULTI-CHIP MODULES AND MICROWAVE CIRCUITS

BACKGROUND OF THE INVENTION

1. Technical Field

This invention relates to multi-layer microstrip structures and, more particularly, to superconducting multi-layer microstrip structures with at least one dielectric layer made of benzocyclobutene deposited adjacent a superconducting layer.

2. Background

Microwave and radio frequency (RF) circuits typically require passive circuit components, such as filters, delay lines, couplers, etc., which are based on transmission lines. Multi-chip modules (MCMs), which require high density, low attenuation interconnect wiring between chips, share many of the technical requirements of the passive circuit components for microwave circuits.

Waveguide transmission lines or waveguides, which have low attenuation and high frequency capabilities, were initially employed for microwave circuits. However, more compact transmission lines were desired. Use of microstrip and stripline structures instead of waveguides provided both size and weight savings in RF and microwave circuits. Typically such microstrip and stripline structures include metal wiring, such as copper, gold or silver, deposited on a substrate made from ceramic, epoxy or crystal. For example see K. C. Gupta, R. Garg, and I. Bahl, *Microstrip Lines and Slotlines* (Artech House Inc. 1979), hereby incorporated by reference. However, the metal microstrip wiring suffers from resistive losses which adversely affect insertion loss and prohibit use of the metal microstrip wiring in narrowband microwave filters. Compactness of the metal microstrip wiring is limited since the resistive losses increase as the width and height of the metal microstrip wiring decreases. Resistive losses and line attenuation also limit wiring density for MCMs.

To alleviate the resistive losses, superconducting films have been employed. For example, see R. S. Wither, "Passive Microwave Devices and Their Applications", *The New Superconducting Electronics* (Klewer Academic Publishers 1993), hereby incorporated by reference. Two superconducting transmission line approaches have heretofore been employed namely, substrate-based microstrip and deposited thin film. Substrate-based microstrip are typically 30–500 microns thick and rely on a substrate material to act as an insulating dielectric for the transmission line. Deposited thin film microstrips are typically 0.01 to 1 micron thick and require a groundplane to be deposited on top of the substrate. All conducting and insulating layers of the transmission line are built on top of the supporting substrate. While the deposited thin film approach produces more compact devices than either the waveguide or substrate-based microstrip, the thinness of the dielectric limits power handling capacity, reduces efficient coupling and restricts lithographically practical impedance ranges.

A superconducting multi-layer process with low resistive losses has been developed using mullite and polyimide. See S. Tanahashi et al. "Superconducting Multichip Module for Josephson Computer Circuits", Fourth International Superconductive Electronics Conference (1993), which is hereby incorporated by reference. The multi-layer process has its drawbacks due to the high processing temperatures required for curing the resins. This reduces the current carrying capacity of the superconducting films by a factor of 5.

What is needed is a compact microstrip structure with low attenuation, low resistance losses, efficient coupling characteristics, controllable impedance and high power handling capability.

SUMMARY OF THE INVENTION

A multi-layer microstrip structure according to the invention includes a substrate and a first superconducting layer deposited on the substrate. A first dielectric layer, made at least partially of benzocyclobutene (BCB), is deposited on the first superconducting layer.

According to another feature of the invention, a second superconducting layer is deposited on the first dielectric layer.

In still another feature of the invention, the first and second superconducting layers are made at least partially of niobium.

In yet another feature of the invention, a second dielectric layer, made at least partially of benzocyclobutene (BCB), is deposited on the second superconducting layer, and a third superconducting layer is deposited on the second dielectric layer.

According to other features of the invention, the substrate is made at least partially of silicon. The multi-layer microstrip structure is utilized as a passive circuit element, or as a multi-chip module.

BRIEF DESCRIPTION OF THE DRAWINGS

The various advantages of the present invention will become apparent to those skilled in the art after studying the following specification and by reference to the drawings in which.

DESCRIPTION OF THE PREFERRED EMBODIMENT

While the present invention is described below in conjunction with a delay line and a multi-chip module (MCM), skilled artisans can appreciate that the multi-layer microstrip structure according to the present invention has a much broader application.

Figure 1:
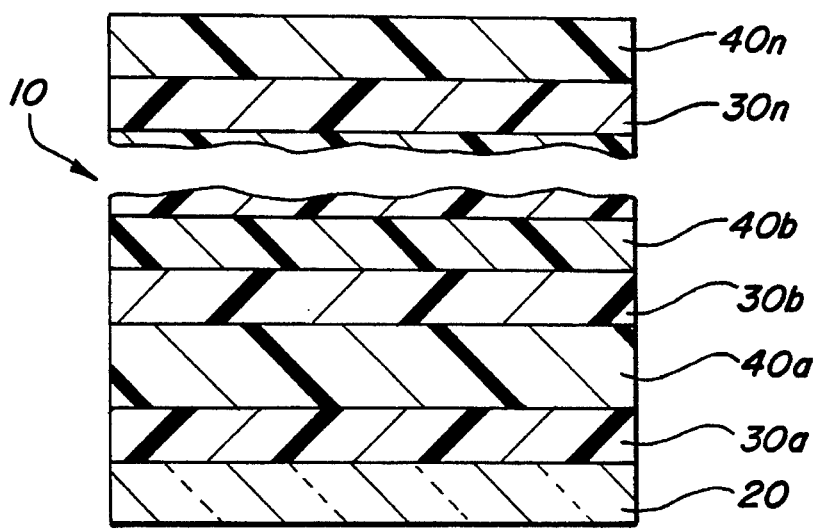
FIG. 1 is a cross-sectional view of a multi-layer microstrip structure according to the invention.

In FIG. 1, a superconducting multi-layer microstrip structure bearing general identification numeral 10 includes a supporting substrate 20. A first superconducting layer 30a is deposited on supporting substrate 20. First superconducting layer 30a and subsequent deposited layers described below can also be patterned in a conventional manner. The first superconducting layer 30a acts as a first wiring/groundplane metallization. A dielectric layer 40a is deposited on the first superconducting layer. Additional superconducting layers 30b to "30n" and dielectric layers 40b to "40n" are alternately deposited as shown in FIG. 1. The multi-layer structure 10 forms multi-level microstrip, stripline and interconnect circuits. Superconducting layers can be interconnected, if desired, by vias which can be implemented in a conventional manner, for example using etching or lift-off techniques. Preferably, the dielectric layer 40a is a polymerized, cross-linked film such as benzocyclobutene (BCB), supporting substrate 20 is made of silicon, and the first superconducting layer is made of niobium.

The use of a material such as BCB offers significant advantages for high speed circuits. The low dielectric constant of BCB leads to high wave velocity and low time-of-flight delays for signal propagation. The dielectric constant of BCB was measured using a standard linear resonator measurement techniques (as described in *MicroStrip Lines and Slotlines* by K. C. Gupta, R. Garg, and I. J. Bahl, Artech (1979), pp- 33–35). The wave velocity for Nb/BCB/Nb microstrip was measured. After correcting for fringing fields and penetration depth effects (as described in a paper by W. H. Chang entitled "The Inductance of a Superconducting Strip Transmission Line", J Appl Phys Vol 50, (1979) pp. 8129–8134), the dielectric constant of 2.6 was determined with an uncertainty of +/−0.08.

The resonator analysis techniques were used to measure the total loss of the microstrip system, including losses due to the superconductor, dielectric losses within the BCB, and radiative losses. The loaded resonator "Q" values in excess of 10,000 were measured. This data, represented a microwave dielectric loss tangent of no more than 0.0001 at low temperatures. The low insertion loss measured in both delay lines and narrow band filters confirmed the data.

The low loss of a superconductor/BCB/superconductor system provides important thermal loading advantages. For example, microwave energy lost to the dielectric and conductor dissipates in the form of heat. Cryogenic systems must continuously remove this heat to maintain a constant temperature. Having low total loss minimizes the refrigeration costs associated with the system for a given microwave and microwave loss energy throughput. The device of this invention showed little heat increase and microwave loss as measured in delay line losses, filter losses, and resonator Q.

Use of BCB allows a wide range of thicknesses, from 0.5 to 25 microns. This variable thickness in conjunction with variable widths allows freedom in tailoring impedance and power handling capacity of the transmission line. As compared with multi-layered ceramic and microwave monolithic integrated circuit (MMIC) approaches, the multi-layer structure according to the invention allows a factor of 10 improvement in circuit density for multi-chip modules (MCMs) and microwave circuits.

Preferably, the BCB employed is BCB CYCLOTENE™ distributed by Dow Chemical Company based in Midland, Mich. using the manufacturer's suggested processing steps. The superconducting and dielectric layers show little or no pin-holing and very low defect densities. These are important features for increasing yields of large area multi-level circuits. BCB planarizes which further increases yield in multi-level MCM backplanes and microwave circuits. Non-planarizing approaches suffer from step coverage and stress problems as layer count increases.

The material of this invention absorbs and re-emits very little moisture. In contrast, competing materials such as polyimide desorb water during processing which creates problems in the integrity of subsequently deposited films. Variable moisture content also causes dimensional changes and inconsistent electrical properties. Unlike the polyimides, BCB does not devolve gas during processing. Nitrogen emitted by polyimide disrupts subsequent layers unless removed completely.

BCB cures at lower temperatures than competing materials such as polyimide, 230° C. vs. 400° C. Lower curing temperatures allow fabrication of active devices, such as Josephson tunnel junctions, which would be destroyed or otherwise experience significant decreases in current carrying ability at higher processing temperatures. Additionally, the multi-layer microstrip structures according to the invention can survive repeated cycling between room temperature and liquid helium temperature (4° kelvin).

Figure 2:
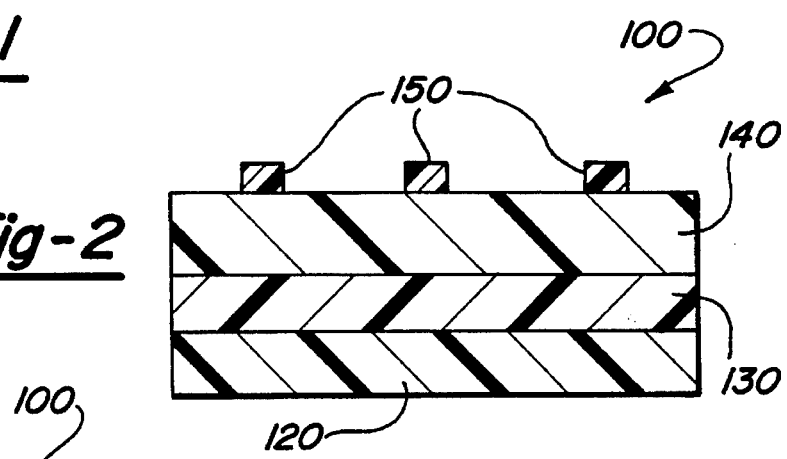
FIG. 2 is a cross-sectional view of a delay line incorporating the multi-layer microstrip structure of FIG. 1.
Figure 3:
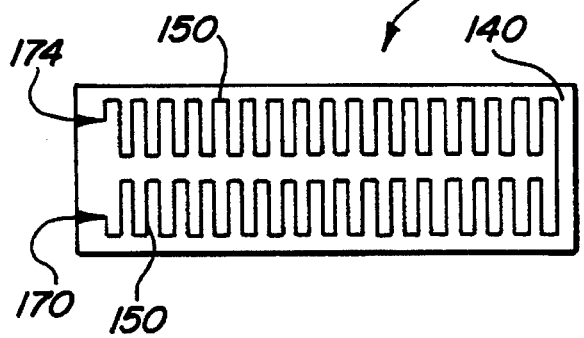
FIG. 3 is a top view of the delay line of FIG. 2.
Figure 4:
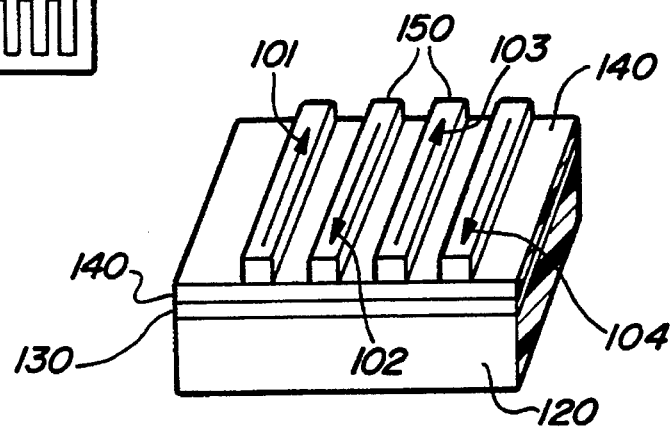
FIG. 4 is a perspective, cross-sectional view of the delay line of FIGS. 2 and 3.

Referring to FIG. 2, a delay line 100 is shown and includes a substrate 120, a first superconducting layer 130 deposited on substrate 120, a dielectric layer 140 deposited on first superconducting layer 130, and superconducting wiring 150 deposited on dielectric layer 140. Each of these layers and subsequent layers described below can be patterned in a conventional manner. Referring to FIG. 3, delay line 100 includes an input 170 and an output 174. In FIG. 4, arrows 101, 102, 103, and 104 illustrate a signal flowing through adjacent wiring 150 of the delay line. The superconducting layer 130 operates as a groundplane.

Preferably, first superconducting layer 130 and wiring 150 are made of niobium, and dielectric layer 140 is made of BCB. Delay lines according to the invention provide high delay density with wideband, low-loss operation. For example, delay lines providing 20 nanoseconds delay can be implemented using the multi-layer structure on a 1 cm$^2$ chip with an insertion loss less than 1 decibel (dB) at 5 GigaHertz (GHz).

As will be appreciated by skilled artisans, other passive elements, such as resonators, couplers, filters, etc. similarly benefit from the multi-layer microstrip structure according to the present invention. For example, bandpass microwave filters (e.g. at 2.5 GHz) employing the multi-layer microstrip structure are compact and have low insertion loss (1.5 dB) in a narrow (1%) passband and high rejection (70 dB) of out-of-band signals.

Figure 5A:
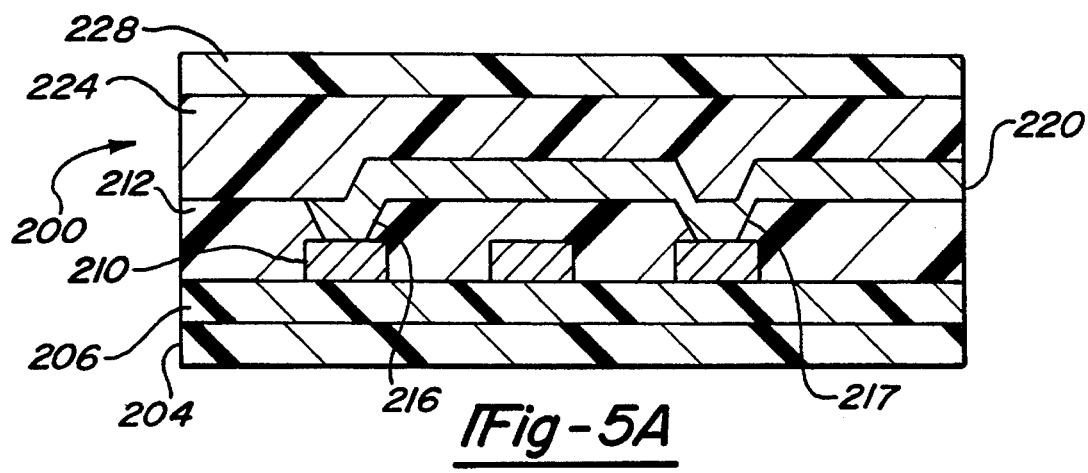
FIG. 5A is a cross-sectional view of an example multi-chip module (MCM) structure showing X- and Y-wiring layers, a power plane, dielectric layers, and a ground plane according to the invention.

Referring to FIG. 5A, a MCM structure 200 according to the invention is shown and includes a first superconducting layer 204 acting as a ground plane. A first dielectric layer 206 is deposited on first superconducting layer 204. Each of these layers and subsequent layers described below can be patterned in a conventional manner. As used herein, the X-axis is perpendicular to the plane defined by the sheet containing FIG. 5A and the Y-axis runs horizontally. An X-axis wiring layer (X-wiring layer) 210 is deposited on first dielectric layer 206. A second dielectric layer 212 is deposited on X-wiring layer 210.

A Y-axis wiring layer (Y-wiring layer) 220 is deposited on second dielectric layer 212. Contacts or vias 216 and 217, connecting X- and Y-wiring layer can be implemented in any suitable manner. For example, dielectric layer 212 can then be deposited and portions adjacent X-wiring layer can be removed using conventional etching and lift-off techniques. Contacts or vias 216 and 217, which can be made of superconducting material, can then be deposited. A third dielectric layer 224 is deposited on Y-wiring layer 220. A third superconducting layer 228 is deposited on third dielectric layer 224.

Figure 5B:
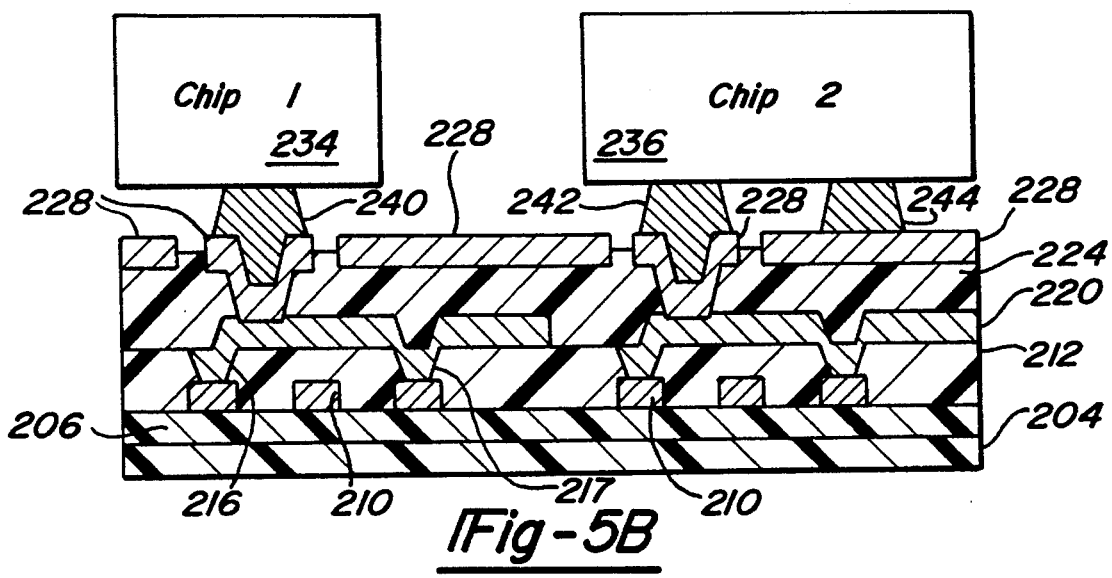
FIG. 5B is a cross-sectional view of the MCM of FIG. 5A after connection to first and second chips.

Referring to FIG. 5B, MCM structure 200 is shown with first and second microchips 234 and 236 having one or more nodes 240, 242, and 244 connected to top-most superconducting layer 228. Nodes 240 of first microchip 234 connect second superconducting layer 228 with Y-wiring layer 220. Similarly node 242 of second microchip 242 connects second superconducting layer 228 with Y-wiring layer 220.

Preferably, the dielectric layers are made of BCB and the superconducting layers are made of niobium. The multi-layer structure of the present invention provides both improved performance and an excellent supporting package for connecting multiple microchips.

Figure 6:
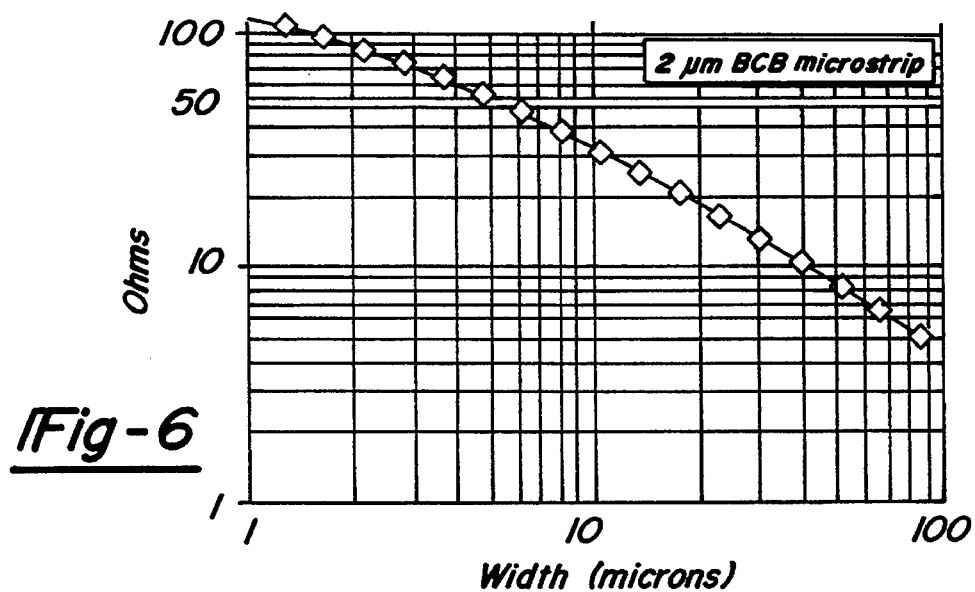
FIG. 6 is a graph of impedance versus the width of the superconducting wiring for multi-layer structures incorporating benzocyclobutene as the dielectric.

As can be appreciated from FIG. 6, the impedance of the BCB microstrip can be easily designed to cover the useful range of impedances for microwave circuits. When designing microstrip circuits, designers typically require a given number of wavelengths of material at a select impedance. Generally, desirable impedances range from several Ohms ($\Omega$) to 150 $\Omega$. FIG. 6 illustrates the impedances for a multi-layer microstrip structure similar to that shown in FIG. 2. The dielectric layer 140, deposited on superconducting layer 130, is 2 micrometers thick. The superconducting wire 150 has indicated impedances for the indicated widths. Thus, the multi-layer microstrip structure can easily provide the useful range of impedances for design purposes.

The various advantages of the present invention will become apparent to those skilled in the art after a study of the foregoing specification and following claims.

What is claimed is:

1. A multi-layer microstrip structure comprising:

a substrate;

a first superconducting layer, comprising niobium, deposited on said substrate; and a first dielectric layer, comprising benzocyclobutene (BCB), deposited on said first superconducting layer.

2. The multi-layer microstrip structure of claim 1 further comprising:

a second superconducting layer deposited on said first dielectric layer.

3. The multi-layer microstrip structure of claim 2 wherein said second superconducting layer is comprising niobium.

4. The multi-layer microstrip structure of claim 2 further comprising:

a second dielectric layer, comprising benzocyclobutene (BCB), deposited on said third superconducting layer; and a fourth superconducting layer deposited on said second dielectric layer.

5. The multi-layer microstrip structure of claim 4 wherein said second, third and fourth superconducting layers are comprised of niobium.

6. The multi-layer microstrip structure of claim 1 wherein said substrate is made at least partially of silicon.

7. The multi-layer microstrip structure of claim 1 wherein said multi-layer microstrip structure is utilized as a passive circuit element.

8. The multi-layer microstrip structure of claim 1 wherein said multi-layer microstrip structure is utilized as a multi-chip module.

9. The multi-layer microstrip structure of claim 7 wherein said second superconducting layer is deposited as a conducting wire with an input and an output.

10. A multi-layer microstrip structure fabricated on a supporting substrate comprising:

a superconducting layer, comprising niobium, deposited on said substrate;

a dielectric layer, comprising benzocyclobutene (BCB), deposited on said superconducting layer; and a superconducting wiring layer deposited on said dielectric layer.

* * * * *